United States Patent
Reinart

(10) Patent No.: US 9,584,160 B2
(45) Date of Patent: Feb. 28, 2017

(54) DYNAMICALLY CONFIGURING ERASURE CODE REDUNDANCY AND DISTRIBUTION

(71) Applicant: Quantum Corporation, San Jose, CA (US)

(72) Inventor: John Reinart, Roseville, MN (US)

(73) Assignee: Quantum Corporation, San Jose, CA (US)

( * ) Notice: Subject to any disclaimer, the term of this patent is extended or adjusted under 35 U.S.C. 154(b) by 99 days.

(21) Appl. No.: 14/185,331

(22) Filed: Feb. 20, 2014

(65) Prior Publication Data

US 2015/0236725 A1    Aug. 20, 2015

(51) Int. Cl.
*H03M 13/35* (2006.01)
*G06F 11/10* (2006.01)
*H03M 13/37* (2006.01)

(52) U.S. Cl.
CPC ....... *H03M 13/35* (2013.01); *H03M 13/3761* (2013.01)

(58) Field of Classification Search
CPC ............. G06F 11/1076; G06F 11/2094; G06F 2211/1028; G06F 3/0614; G06F 11/3409; G06F 17/30283; G06F 11/3034; G06F 11/1088; G06F 11/1662; G06F 11/30; G06F 11/3055; G06F 11/10; H03M 13/35; H03M 13/3761
See application file for complete search history.

(56) References Cited

U.S. PATENT DOCUMENTS

| | | | |
|---|---|---|---|
| 9,032,061 B1* | 5/2015 | Xin et al. | 709/223 |
| 2010/0020718 A1* | 1/2010 | Tabbara et al. | 370/254 |
| 2010/0095004 A1* | 4/2010 | Zuckerman | H04L 67/1008 709/226 |
| 2015/0227416 A1* | 8/2015 | Reinart | G06F 17/30082 714/763 |
| 2015/0229339 A1* | 8/2015 | Reinart | H03M 13/373 714/752 |

* cited by examiner

*Primary Examiner* — Albert Decady
*Assistant Examiner* — Kyle Vallecillo
(74) *Attorney, Agent, or Firm* — Eschweiler & Associates, LLC

(57) ABSTRACT

Example apparatus and methods monitor conditions in a tiered storage system. The conditions monitored may include the availability of different numbers and types of devices including an erasure code based object storage system. The conditions monitored may also include the availability and type of devices available to the erasure code based object storage system. A redundancy policy for storing an item using the erasure code based object storage system may be determined based on the conditions. Erasure codes associated with the item may then be stored in the erasure code based object storage system as controlled, at least in part, by the redundancy policy. The redundancy policy for the erasure codes may be updated dynamically in response to changing conditions on the tiered storage system.

8 Claims, 10 Drawing Sheets

DYNAMICALLY CONFIGURING ERASURE CODE REDUNDANCY AND DISTRIBUTION

BACKGROUND

Different approaches, devices, and collections of devices may be used to protect files, information about files, or other electronic data. For example, a tiered archive system may use tape drives, disk drives, solid state drives (SSD), and an object store to store a file, to store information about a file, to store redundant copies of files, or to store other electronic data.

To insure data protection, different approaches for storing redundant copies of items have been employed. Erasure codes are one such approach. An erasure code is a forward error correction (FEC) code for the binary erasure channel. The FEC facilitates transforming a message of k symbols into a longer message with n symbols such that the original message can be recovered from a subset of the n symbols, k and n being integers, n>k. The original message may be, for example, a file. The fraction r=k/n is called the code rate, and the fraction k'/k, where k' denotes the number of symbols required for recovery, is called the reception efficiency. Optimal erasure codes have the property that any k out of the n code word symbols are sufficient to recover the original message. Optimal codes may require extensive memory usage, CPU time, or other resources when n is large.

Erasure codes are described in coding theory. Coding theory is the study of the properties of codes and their fitness for a certain purpose (e.g., backing up files). Codes may be used for applications including, for example, data compression, cryptography, error-correction, and network coding. Coding theory involves data compression, which may also be referred to as source coding, and error correction, which may also be referred to as channel coding. Fountain codes are one type of erasure code.

Fountain codes have the property that a potentially limitless sequence of encoding symbols may be generated from a given set of source symbols in a manner that supports ideally recovering the original source symbols from any subset of the encoding symbols having a size equal to or larger than the number of source symbols. A fountain code may be optimal if the original k source symbols can be recovered from any k encoding symbols, k being an integer. Fountain codes may have efficient encoding and decoding algorithms that support recovering the original k source symbols from any k' of the encoding symbols with high probability, where k' is just slightly larger than k. A rateless erasure code is distinguished from an erasure code that exhibits a fixed code rate.

Object based storage systems may employ rateless erasure code technology (e.g., fountain codes) to provide a flexible level of data redundancy. The appropriate or even optimal level of data redundancy produced using a rateless erasure code system may depend, for example, on the number and type of devices available to the object based storage system. The actual level of redundancy achieved using a rateless erasure code system may depend, for example, on the difference between the number of readable redundancy blocks (e.g., erasure codes) written by the system and the number of redundancy blocks needed to reconstruct the original data. For example, if twenty redundancy blocks are written and only eleven redundancy blocks are needed to reconstruct the original data that was protected by generating and writing the redundancy blocks, then the original data may be reconstructed even if nine of the redundancy blocks are damaged or otherwise unavailable.

Object based storage systems using rateless erasure code technology may facilitate storing erasure codes generated according to different redundancy policies (e.g., 7/3, 20/9, 20/2). A redundancy policy may be referred to as an N/M redundancy policy where N total erasure codes are generated and the message can be regenerated using any N−M of the N total erasure codes, M and N being integers, M<N.

When an object storage is used in a tiered archive system, the overall data redundancy achieved by the tiered archive system depends on the distribution of data between devices and the redundancy policies associated with the object store. The distribution of data refers to the number and types of devices participating in storing data. The redundancy policies may include an N/M policy. For example, if the tiered archive system includes a RAID-6 tier at one site, and if data is present in the RAID-6 tier, then an optimal overall data redundancy might be provided by implementing a 20/2 erasure code policy at an object storage at a single other site. If the RAID-6 tier is released or becomes otherwise unavailable, then the optimal overall data redundancy may be provided by an 18/8 erasure code policy spread across three sites. The "optimal" overall data redundancy may be defined by, for example, a system administrator or data retention expert.

Since conditions in a tiered archive system can vary dynamically as, for example, devices become available or unavailable, the optimal overall data redundancy may also vary dynamically. However, conventional tiered archive systems may use pre-defined configuration settings to statically determine erasure code policies.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Example apparatus and methods account for dynamically changing conditions in a storage system that uses an erasure code based object store. Conditions may vary dynamically as, for example, devices become available or unavailable. Example apparatus and methods also account for the fact that the optimal overall data redundancy may vary dynamically as a function of the conditions in the storage system. While conventional systems may use pre-defined configuration settings to statically determine erasure code redundancy policies, example apparatus and methods may dynamically identify optimum overall redundancy based on current conditions in a system. Example apparatus and methods may identify redundancy policies to be employed based on the current optimum overall redundancy. The redundancy policies may identify N/M policies that control the number of erasure codes generated and the distribution of those erasure codes. In one embodiment, the redundancy policies may be identified from user defined rules. In another embodiment, the redundancy policies may be identified from automated redundancy rules. In one embodiment, redundancy policies may be determined for an erasure code based object store operating in a tiered archive system.

The redundancy level may control how many erasure codes above the minimum number of erasure codes needed to reconstruct an item are stored. Recall that using erasure codes, an N/M policy may be employed to store data, M and N being integers, M<N. The N/M policy refers to the fact that to reconstruct a message for which N erasure codes are generated, only N−M erasure codes may need to be accessed. While N erasure codes may be generated, example apparatus and methods may control how many of the N erasure codes are stored in an object store based on the safety factor to be protected by the N erasure codes. The N−M erasure codes may be stored on a single device or may be distributed between two or more devices.

Example apparatus and methods may provide or interact with a user interface that facilitates identifying an N/M policy, a distribution rule, or a redundancy rule for a tiered archive system. A tiered archive system may provide hierarchical storage management where data is automatically moved between storage media. Data may be moved based, for example, on the cost of storing the data on different media, on how quickly the data needs to be retrieved, or based on other factors. Hierarchical storage management facilitates moving data between, for example, high-speed storage devices like hard disk drive arrays and low-speed storage devices like tape libraries. While it may be ideal to have all data always available on the fastest possible storage device, this ideal may be too expensive to achieve. Hierarchical storage management may migrate data files that are used most frequently to higher speed access devices and may migrate data files that are used least frequently to lower speed access devices.

Figure 1:
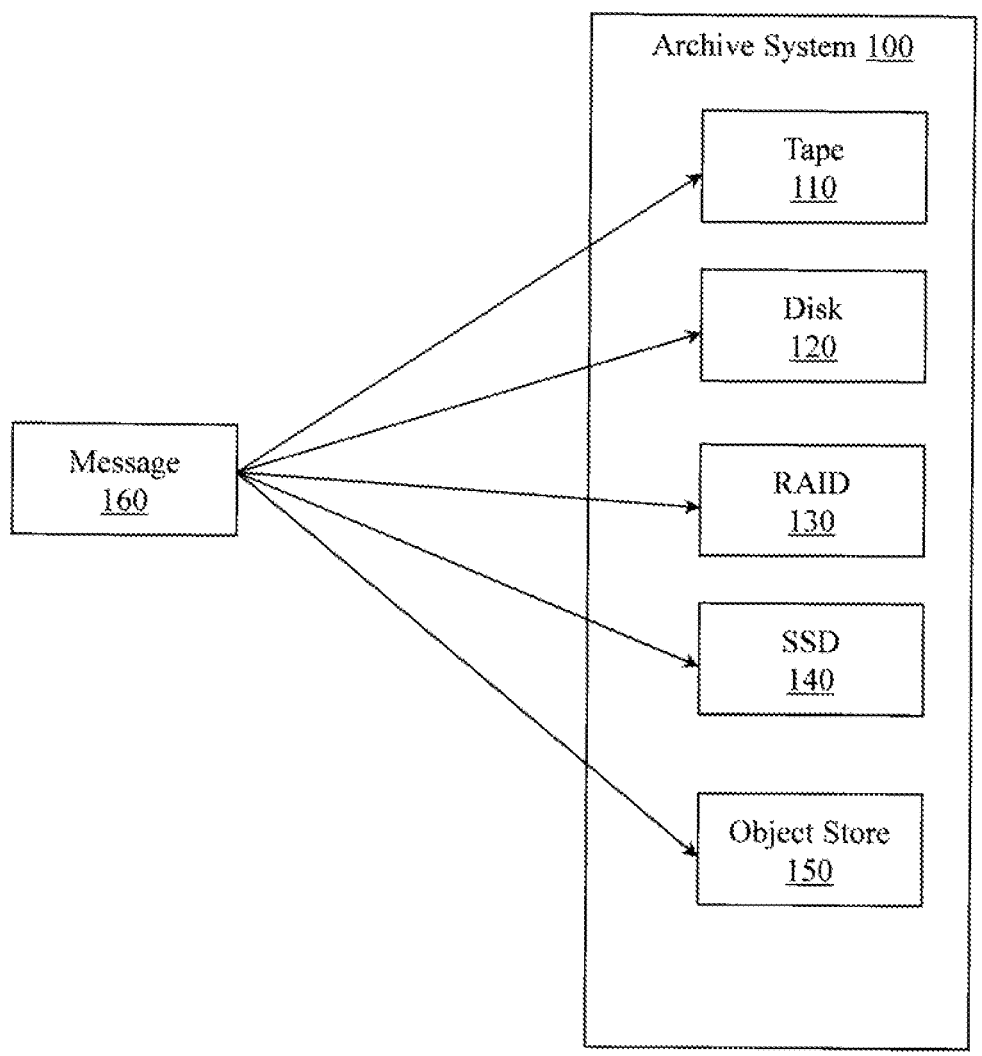
FIG. 1 illustrates a tiered archive system with an object store.

FIG. 1 illustrates a tiered archive system 100. A tiered archive system may include several devices arranged in different tiers to provide different levels of redundancy for an item to be stored. For example, archive system 100 includes a tape 110, a disk 120, a RAID system 130, an SSD 140, and an object store 150. Different tiered archive systems may include a greater or lesser number of a similar or different variety of devices. The tiered archive system 100 may store a message 160. Message 160 may be, for example, a file, a record, an object, a table, or other electronic data. Multiple copies of message 160 may be stored in archive system 100. For example, a copy of message 160 may be stored on tape 110, two copies may be stored on disk 120, a copy may be distributed throughout RAID system 130, and a copy may be stored on object store 150. Not all devices in an archive system 100 may be employed to store an item.

Figure 2:
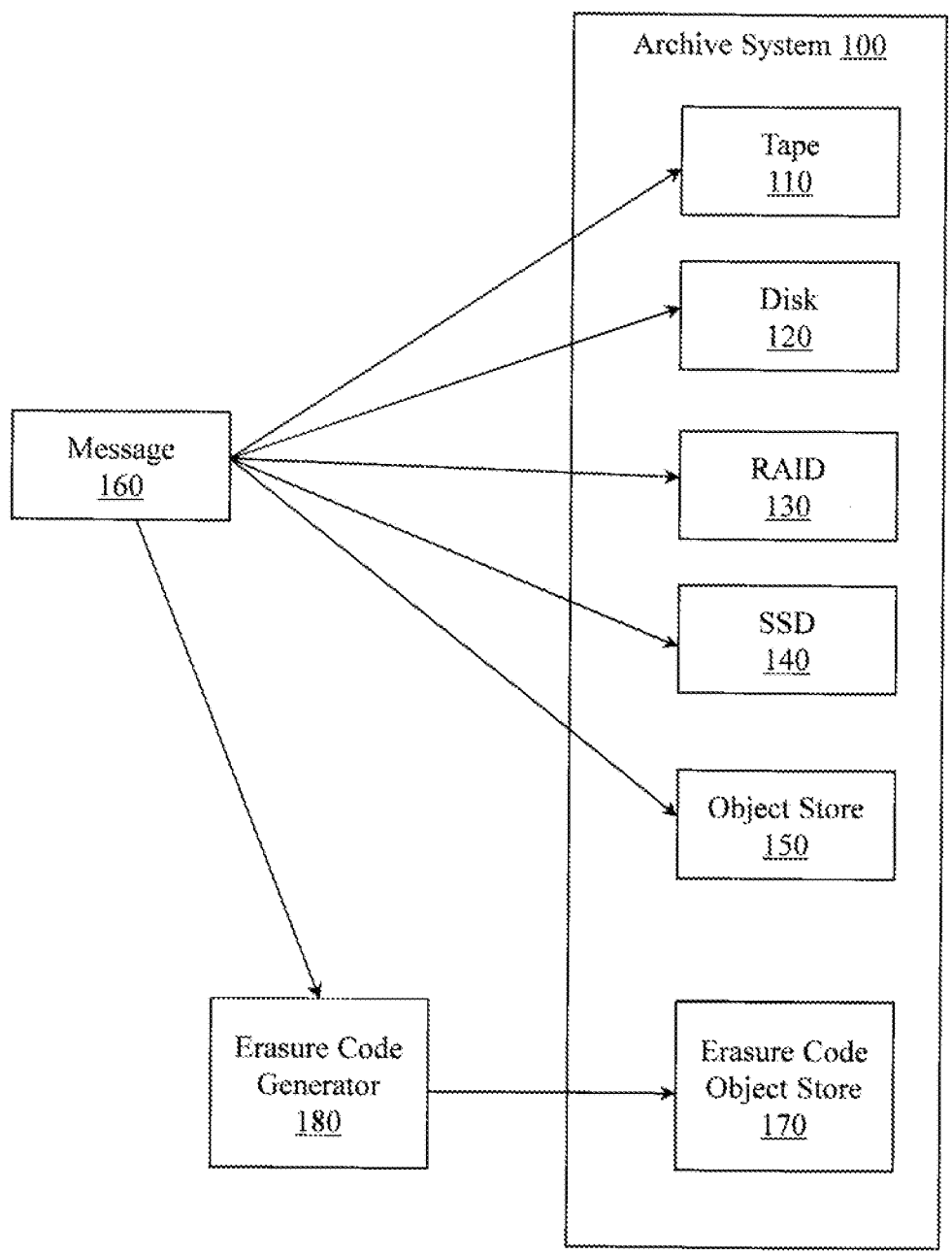
FIG. 2 illustrates a tiered archive system with an object store that uses erasure code technology.

FIG. 2 illustrates another embodiment of a tiered archive system 100. This embodiment includes an object store 170 that stores items using rateless erasure codes (e.g., fountain codes). The rateless erasure codes for message 160 may be produced by an erasure code generator 180 and then selectively provided to the erasure code object store 170. The erasure code object store 170 may include one or more devices (e.g., disks, SSD). How many erasure codes are generated by erasure code generator 180 may be controlled by an N/M redundancy policy. In one embodiment, the N/M redundancy policy may be determined based on the status (e.g., availability, capacity, reliability) of devices in the archive system 100. In one embodiment, the N/M redundancy policy may be determined based on the status (e.g., availability, capacity, reliability) of devices in the erasure code object store 170. In one embodiment, the N/M redundancy policy may be determined based on the status (e.g., availability, capacity, reliability) of devices in the archive system 100 and the status of devices in the erasure code object store 170.

Figure 3:
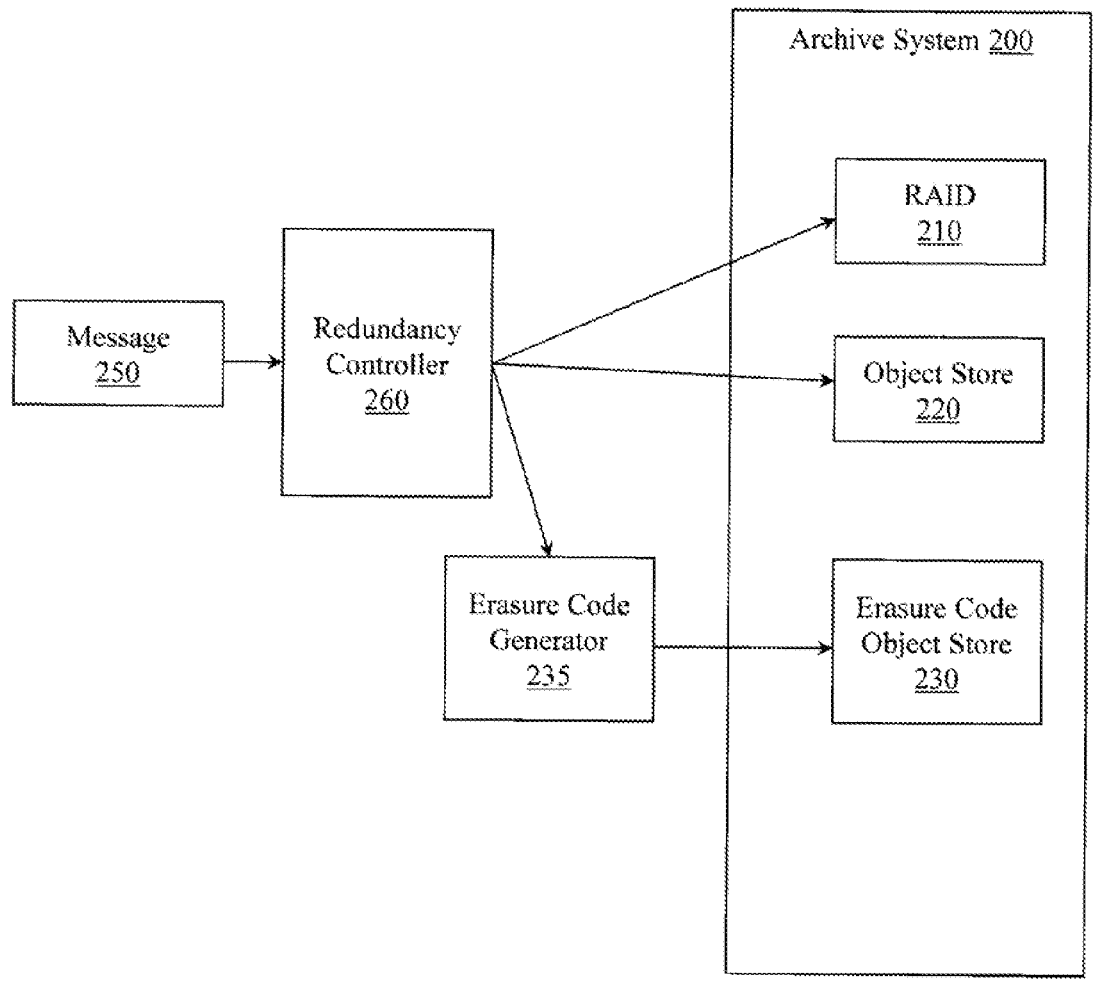
FIG. 3 illustrates distributing a message according to initial conditions.

FIG. 3 illustrates distributing a message 250 according to initial conditions in a tiered archive system 200. The tiered archive system 200 may include a RAID system 210, a non-erasure code based object store 220, and an erasure code based object store 230. Different archive systems may include different combinations of devices. Redundancy controller 260 may receive message 250 and be tasked with storing message 250 according to a desired redundancy level. In one embodiment, the desired redundancy level may be an optimal redundancy level. The definition of "optimal" at any given time may depend on the status of the archive system 200. For example, if RAID 210 is functioning and has sufficient capacity to store message 250, then the optimal redundancy level may reflect the availability and capacity of RAID 210. Similarly, if the object store 220 and the erasure code object store 230 are available, then the optimal redundancy level may reflect the availability and capacity of those devices or systems. Redundancy controller 260 may receive message 250, evaluate the conditions in the archive system 200, and determine how to distribute the message 250 between the devices in the archive system 200. Redundancy controller 260 may also determine an N/M redundancy policy for erasure codes generated for the message 250. The erasure codes may be generated by the erasure code generator 235 and provided to the erasure code object store 230.

Figure 4:
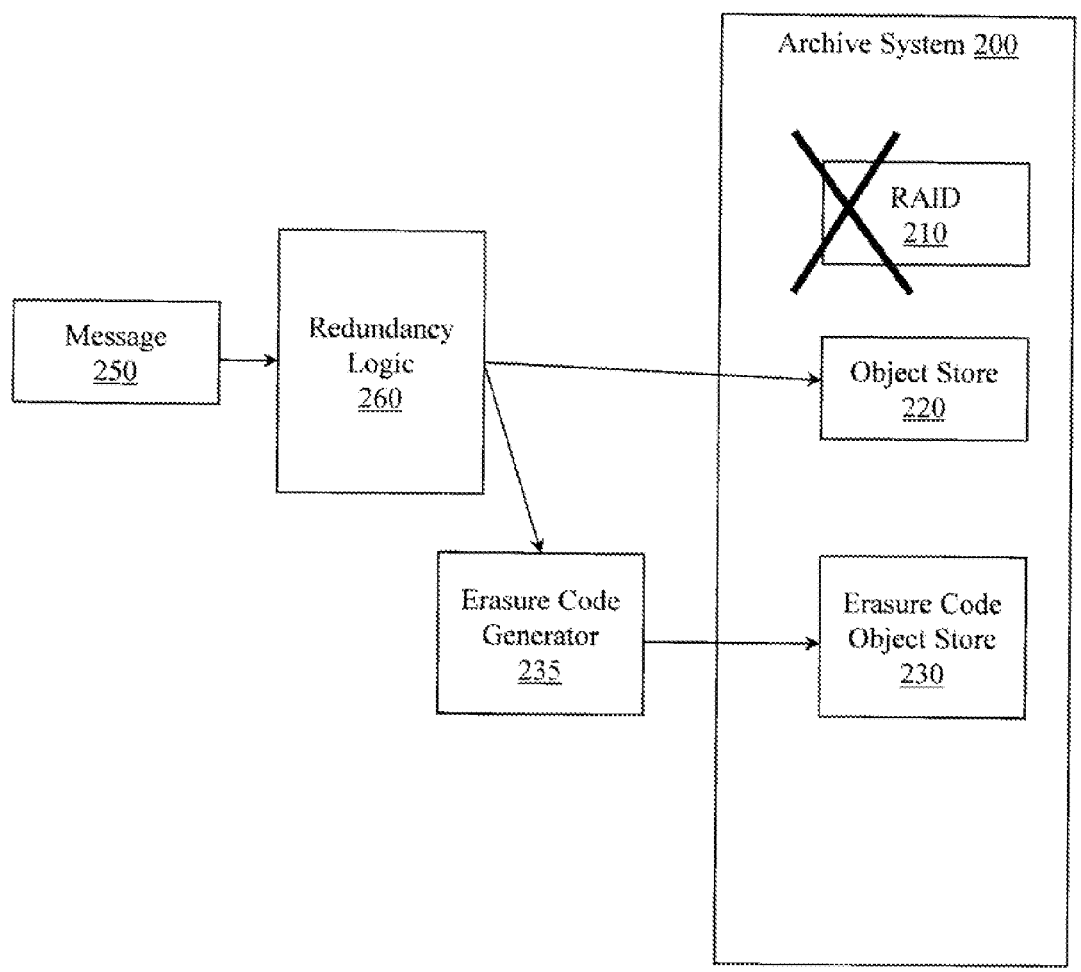
FIG. 4 illustrates redistributing a message in response to changed conditions.

Conditions may change in a tiered archive system. FIG. 4 illustrates re-distributing message 250 in response to changed conditions in the tiered archive system 200. For example, RAID 210 may have become unavailable. Thus, redundancy logic 260 may determine a new N/M redundancy policy.

Figure 5:
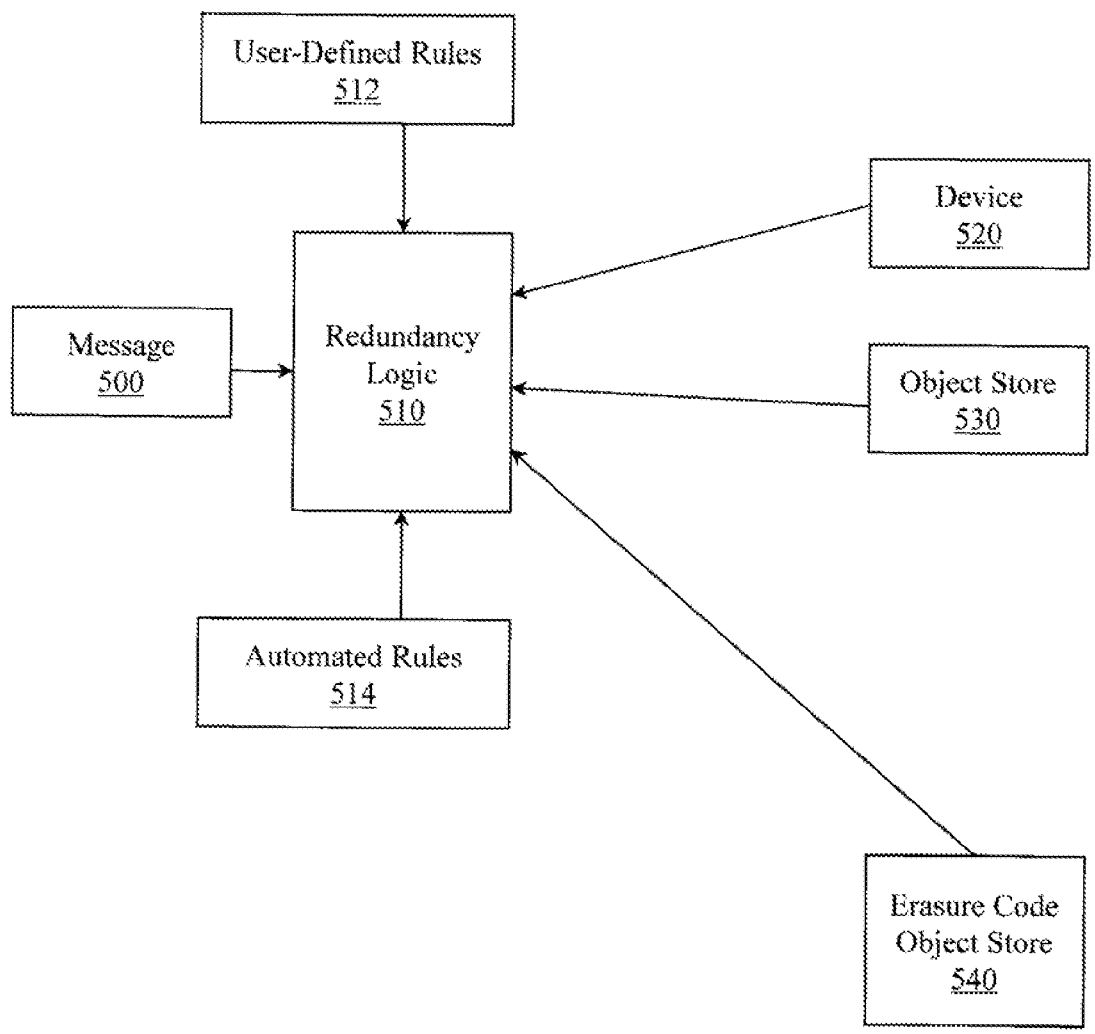
FIG. 5 illustrates an example distribution and redundancy logic.

FIG. 5 illustrates an example redundancy logic 510 gathering information from a device 520, an object store 530, and an erasure code based object store 540. Device 520, object store 530, and erasure code based object store 540 may be part of a tiered archive system. Rather than determine an N/M redundancy policy based on static or pre-configured assumptions, redundancy logic 510 may make decisions based on data received from device 520, object store 530, erasure code object store 540, or other devices or systems associated with a tiered archive system.

Redundancy logic 510 may receive a message 500 and be tasked with making sure that message 500 is stored in a manner that achieves a minimal or optimal redundancy. The redundancy may be determined by the number and type of devices to which the message 500 is written. The redundancy may also be determined by the number of erasure codes that are generated and written for the message. The redundancy may also be determined by the number of devices to which the erasure codes are distributed. In one embodiment, after discovering information concerning devices in the tiered archive system, redundancy logic 510 may determine replication patterns, redundancy policies, or redundancy patterns based on user-defined rules 512. The user-defined rules 512 may define the desired patterns or policies for different possible configurations and conditions of a tiered archive system. In one embodiment, after discovering information concerning the tiered archive system, redundancy logic 510 may determine replication patterns, redundancy policies, or redundancy patterns based on automated rules 514. The automated rules 514 may seek to maximize or even optimize redundancy for message 500.

Some portions of the detailed descriptions herein are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated. The physical manipulations create a concrete, tangible, useful, real-world result.

It has proven convenient at times, principally for reasons of common usage, to refer to these signals as bits, values, elements, symbols, characters, terms, or numbers. It should be borne in mind, however, that these and similar terms are to be associated with the appropriate physical quantities and are merely convenient labels applied to these quantities. Unless specifically stated otherwise, it is to be appreciated that throughout the description, terms including processing, computing, and determining refer to actions and processes of a computer system, logic, processor, or similar electronic device that manipulates and transforms data represented as physical (electronic) quantities.

Example methods may be better appreciated with reference to flow diagrams. For purposes of simplicity of explanation, the illustrated methodologies are shown and described as a series of blocks. However, it is to be appreciated that the methodologies are not limited by the order of the blocks, as some blocks can occur in different orders or concurrently with other blocks from that shown and described. Moreover, less than all the illustrated blocks may be required to implement an example methodology. Blocks may be combined or separated into multiple components. Furthermore, additional or alternative methodologies can employ additional, not illustrated blocks.

Figure 6:
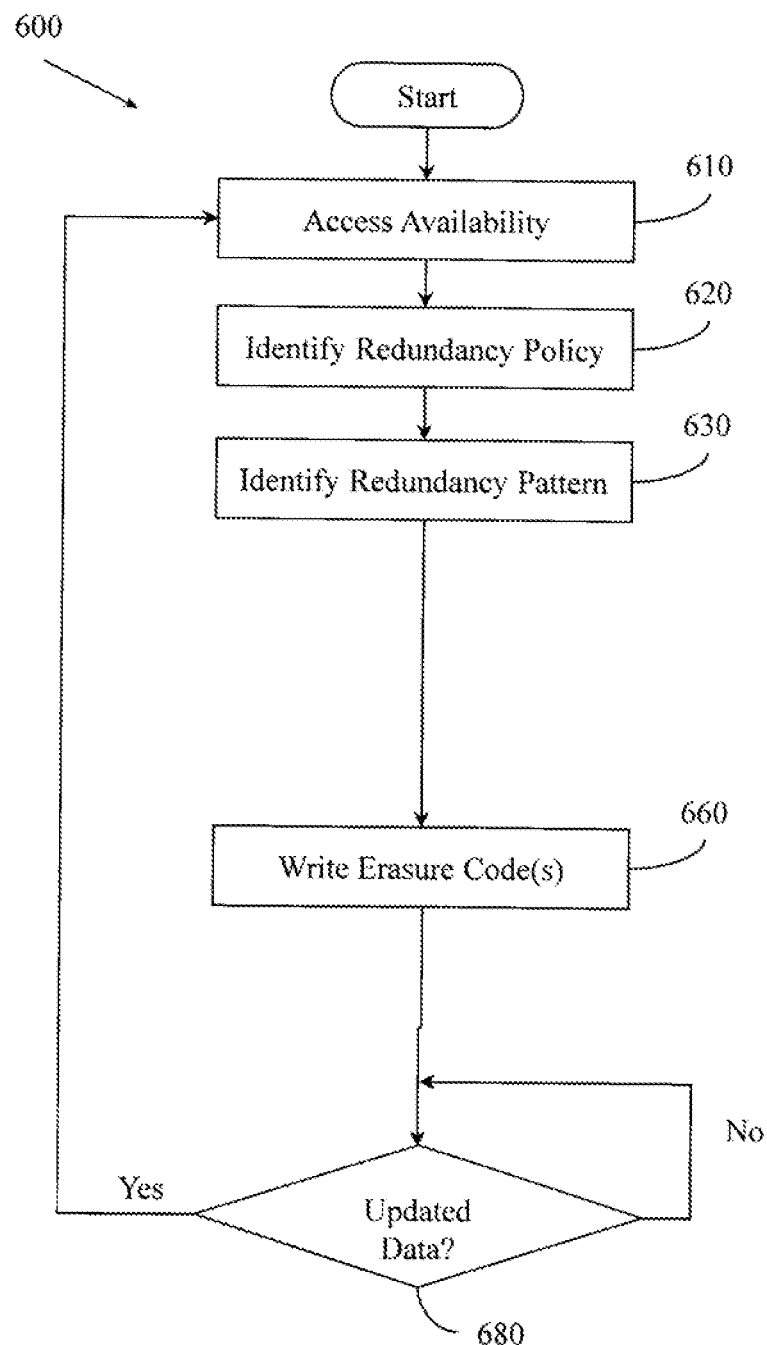
FIG. 6 illustrates an example method associated with dynamically configuring erasure code redundancy.

FIG. 6 illustrates a method 600 associated with dynamically configuring erasure code redundancy. In one embodiment, the erasure code redundancy may be computed for an erasure code based object store in a tiered archive system. Method 600 may include, at 610, accessing availability data concerning a storage device. The storage device may be located in a tiered archive system. The tiered archive system may include an erasure code based object store. In one embodiment, accessing the availability data includes querying the storage device. In another embodiment, accessing the availability data may include receiving the data from the storage device without querying the device. Thus, the availability data may be acquired, among other ways, by using a pull model or by operation of a push model from the tiered storage system. Accessing the availability data may include, for example, reading a computer memory, receiving data in a function call, reading data from a register, or reading data from another computer-readable storage medium.

Method 600 may also include, at 620, identifying an N/M redundancy policy for storing a message using the erasure code based object store. The N/M redundancy policy may be based, at least in part, on the availability data. Recall that an N/M redundancy policy identifies a minimum number N−M of erasure codes needed to reconstruct the message and a maximum number N of erasure codes to be generated for the message, M being less than N, M and N being integers.

In one embodiment, the N/M redundancy policy may be a function of a user defined rule. For example, a user may define the desired number of erasure codes to be produced and the desired distribution of the erasure codes for different anticipated conditions in the tiered storage system. All possible conditions may not be able to be anticipated. Or, a user may choose not to provide a comprehensive set of rules, or even any rules. Thus, in one embodiment, identifying the N/M redundancy policy may be based, at least in part, on an automated rule. The automated rule may identify a minimum number of erasure codes to be present on a minimum number of different devices associated with the erasure code based object store.

Method 600 may also include, at 660, selectively causing an erasure code associated with the item to be stored on the erasure code based object store. The number of erasure codes written at 660 may be controlled by the N/M policy.

At 680, a determination is made concerning whether updated data is available. If updated data is not available, then method 600 may simply wait until updated data becomes available. But if updated data is available, then method 600 may return to earlier actions to identify an updated N/M redundancy policy. The updated N/M redundancy policy may be based on the updated data. In addition to selecting an updated N/M redundancy policy, method 600 may identify an updated object store device to use for storing an erasure code associated with the message. Which object store device is selected as the updated object store device may depend on the updated N/M redundancy policy.

In different embodiments, the determination at 680 may be made after a periodic check of the availability data, upon detecting a changed condition in the tiered archive system, or after receiving a control signal from the tiered archive system.

Figure 7:
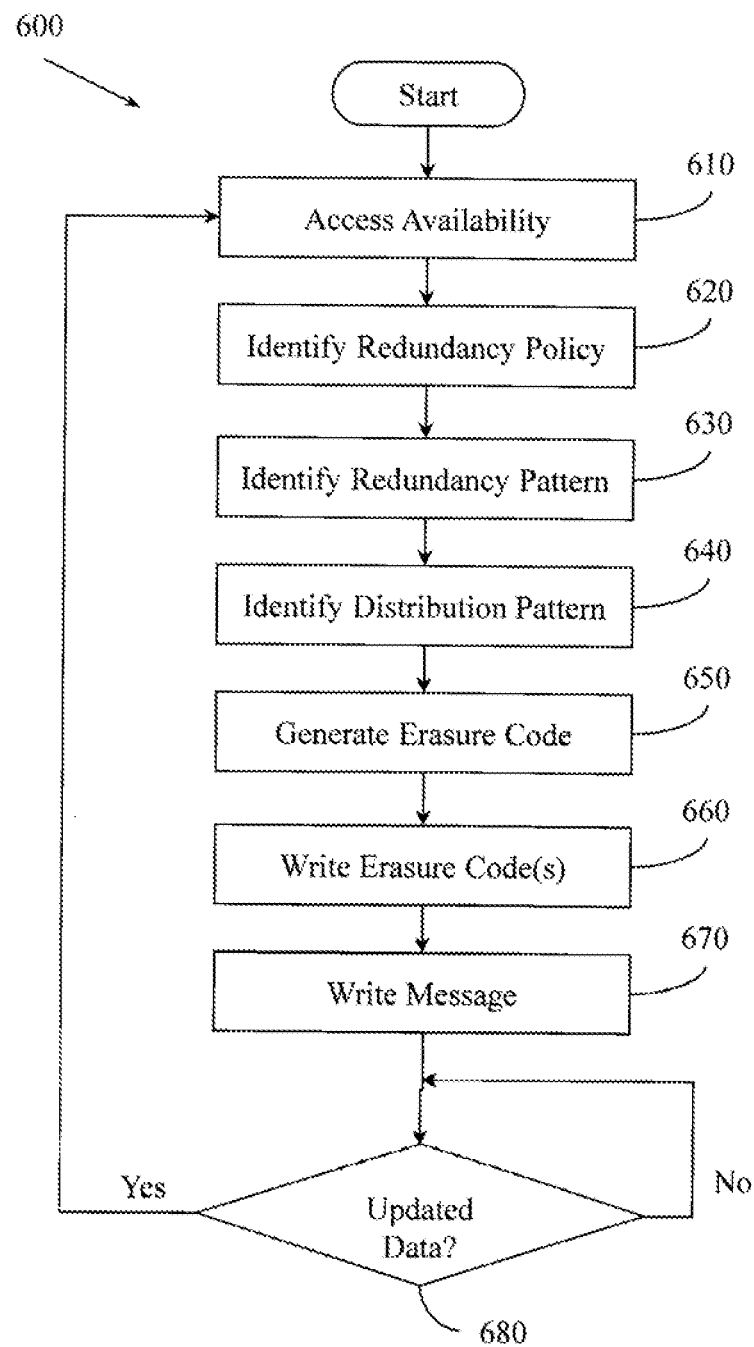
FIG. 7 illustrates an example method associated with dynamically configuring erasure code redundancy.

FIG. 7 illustrates another embodiment of method 600. This embodiment of method 600 also includes, at 650, generating the erasure code. The erasure code may be generated according to the N/M policy. Generating the erasure code may include controlling, for example, a circuit or process to input the message and output the erasure codes.

This embodiment of method 600 also includes, at 670, selectively causing the message to be stored on the non-object store device(s). Causing the message to be stored on the non-object store may include, for example, writing the message to a shared memory, writing the message to a memory, writing the message to a network interface, or providing the message to another computer-readable storage medium.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and other similar terms, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
CD: compact disk.
CD-R: CD recordable.
CD-RW: CD rewriteable.
DVD: digital versatile disk and/or digital video disk.
HTTP: hypertext transfer protocol.
LAN: local area network.
RAM: random access memory.
DRAM: dynamic RAM.
SRAM: synchronous RAM.
RAID: redundant array of independent disks.
ROM: read only memory.
PROM: programmable ROM.
SSD: solid state drive
SAN: storage area network.
USB: universal serial bus.
WAN: wide area network.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer-readable storage medium", as used herein, refers to a non-transitory medium that stores instructions and/or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a data structure (e.g. a list, a queue, a heap, a tree) a memory, a register, or other repository. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include, for example, a software controlled microprocessor, a discrete logic (e.g., ASIC), an analog circuit, a digital circuit, a programmed logic device, or a memory device containing instructions. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, or logical communications may be sent or received. An operable connection may include a physical interface, an electrical interface, or a data interface. An operable connection may include differing combinations of interfaces or connections sufficient to allow operable control. For example, two entities can be operably connected to communicate signals to each other directly or through one or more intermediate entities (e.g., processor, operating system, logic, software). Logical or physical communication channels can be used to create an operable connection.

"Signal", as used herein, includes but is not limited to, electrical signals, optical signals, analog signals, digital signals, data, computer instructions, processor instructions, messages, a bit, or a bit stream, that can be received, transmitted and/or detected.

"Software", as used herein, includes but is not limited to, one or more executable instructions that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, or programs including separate applications or code from dynamically linked libraries.

"User", as used herein, includes but is not limited to one or more persons, software, logics, applications, computers or other devices, or combinations of these.

Figure 8:
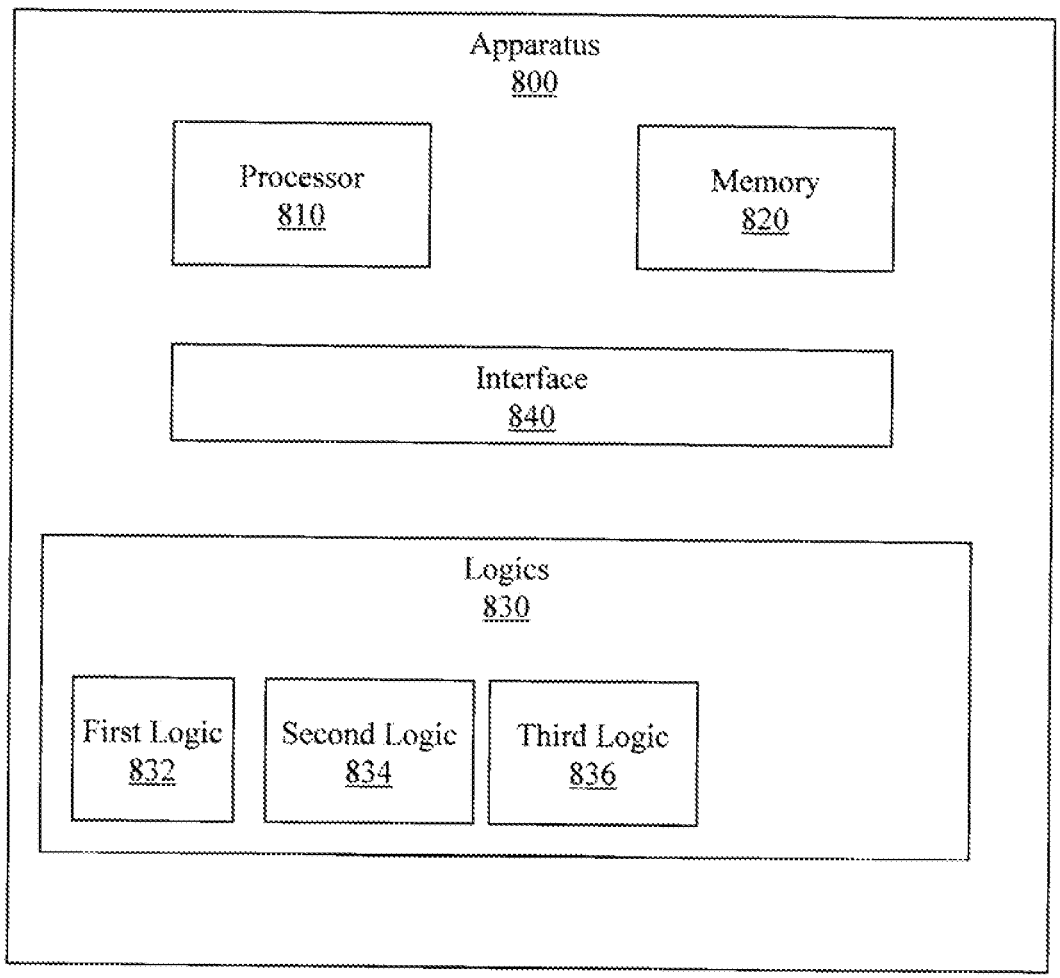
FIG. 8 illustrates an example apparatus configured to dynamically configure erasure code redundancy.

FIG. 8 illustrates an apparatus 800 that includes a processor 810, a memory 820, and a set 830 of logics that is connected to the processor 810 and memory 820 by an interface 840. In one embodiment, the apparatus 800 may be an object storage system. In one embodiment, the apparatus 800 may be operably connected to or in data communication with an object storage system. Recall that an object storage system performs object-based storage using a storage architecture that manages data as objects instead of, for example, as files. "Object", as used herein, refers to the usage of object in computer science. From one point of view, an object may be considered to be a location in a physical memory having a value and referenced by an identifier.

The set 830 of logics may include a first logic 832 that produces a monitor data concerning storage devices associated with a tiered storage system. The tiered storage system may include multiple storage devices (e.g., tape, disk, RAID, object stores). Additionally, the tiered storage system may include an erasure code based object storage system. Producing the monitor data may include, for example, writing electronic values to a computer memory (e.g., RAM, DRAM), writing values to a register, writing values to a disk, or storing other computer-readable data on a computer-readable storage medium.

In one embodiment, the first logic 832 produces the monitor data by acquiring status information for a device or devices in the tiered storage system. In one embodiment, the status information may be acquired periodically. In another embodiment, the status information may be acquired in response to receiving a request to store an item in the tiered storage system. In another embodiment, the status information may be sent from the tiered storage system in response to detecting a change in the status (e.g., availability, capacity, reliability) of a device in the tiered storage system.

The apparatus 800 may also include a second logic 834 that determines a redundancy policy for storing erasure codes for an item. The redundancy policy may depend on the monitor data. The erasure codes will be stored using the erasure code based object storage system.

In one embodiment, the second logic 834 determines the redundancy policy based, at least in part, on the number or type of non-object storage devices in the tiered storage system. For example, when a large number of devices are participating in storing redundant copies of the item, the second logic 834 may produce a first N/M redundancy policy that does not rely heavily on an erasure code based object store while when a smaller number of devices are participating in storing redundant copies the second logic 834 may produce a second N/M policy that relies more heavily on the erasure code based object store. In one embodiment, the second logic 834 may determine the redundancy policy based, at least in part, on the number or type of devices in the erasure code based object storage system. For example, when an erasure code based object storage system only has a single disk, then a first N/M policy may be employed while when multiple disks are available, a different N/M policy may be employed.

The apparatus 800 may also include a third logic 836 that stores the erasure code or codes associated with the item in the erasure code based object storage system. The third logic 836 may store the erasure code or codes as controlled, at least in part, by the redundancy policy.

In one embodiment, the first logic 832 controls the second logic 834 to re-determine the redundancy policy upon detecting a change in the monitor data. For example, when a device becomes (un)available, the redundancy policy may be updated to account for the change in status of the device. The first logic 832 may also control the third logic 836 to re-store erasure codes associated with the item upon detecting the change in the monitor data.

Figure 9:
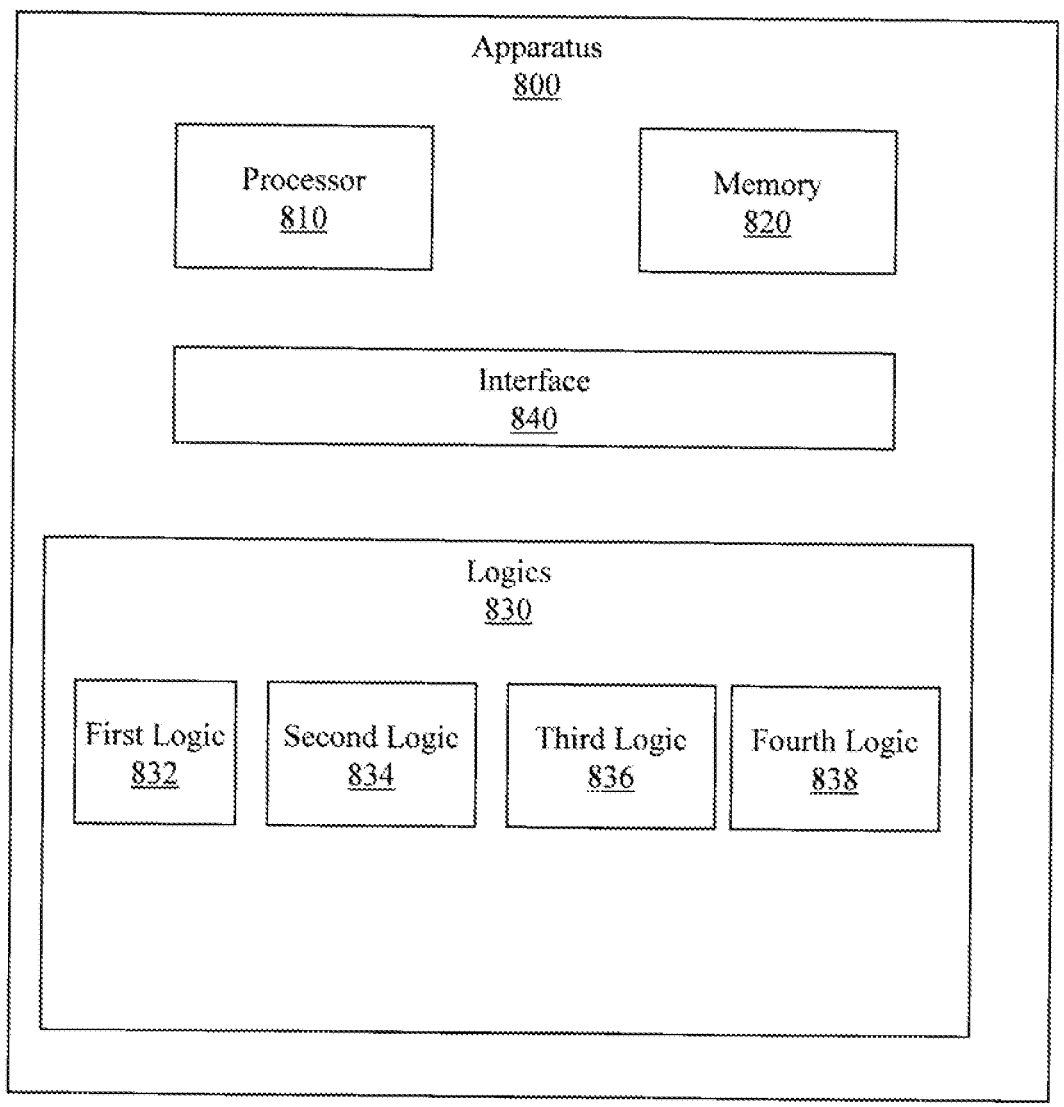
FIG. 9 illustrates an example apparatus configured to dynamically configure erasure code redundancy.

FIG. 9 illustrates another embodiment of apparatus 800. This embodiment includes a fourth logic 838. The fourth logic 838 may produce the erasure codes for the item. In one embodiment, the fourth logic 838 is controlled, at least in part, by the redundancy policy. Producing the erasure codes may include, for example, receiving a message, accessing the redundancy policy, and writing erasure codes to a computer-readable storage medium.

Figure 10:
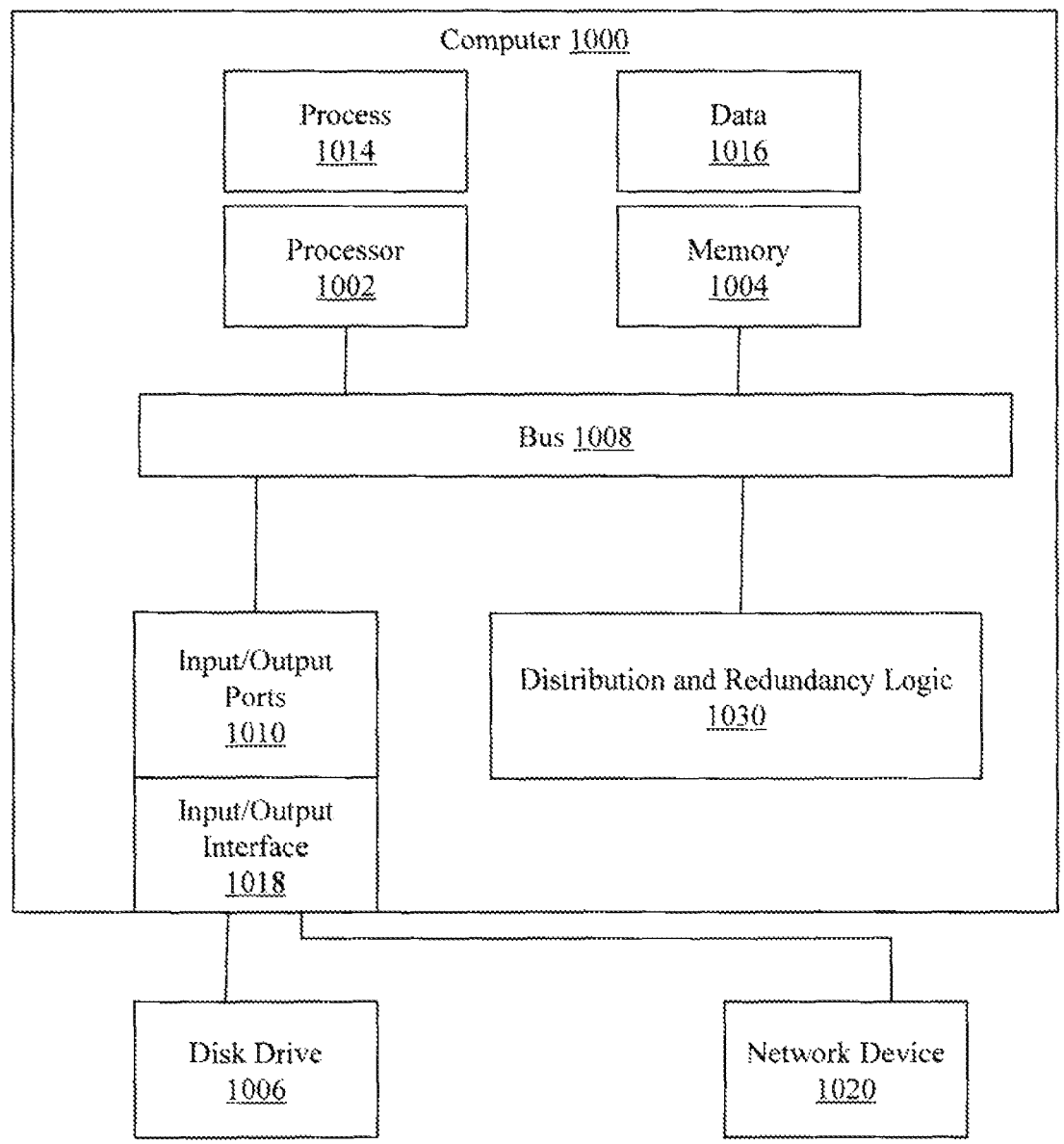
FIG. 10 illustrates an example apparatus associated with dynamically configuring erasure code redundancy in a tiered archive system.

FIG. 10 illustrates an example computing device in which example systems and methods described herein, and equivalents, may operate. The example computing device may be a computer 1000 that includes a processor 1002, a memory 1004, and input/output ports 1010 operably connected by a bus 1008. In one example, the computer 1000 may include a redundancy logic 1030 that controls the distribution of a message within a tiered archive system that produces a redundancy policy for generating and writing erasure codes for the message, and that controls the distribution of erasure codes between devices available to an object store. In different examples, the logic 1030 may be implemented in hardware, software, firmware, and/or combinations thereof. While the logic 1030 is illustrated as a hardware component attached to the bus 1008, it is to be appreciated that in one example, the logic 1030 could be implemented in the processor 1002.

In one embodiment, logic 1030 may provide means (e.g., hardware, software, firmware, circuit) for identifying the number and types of devices available to participate in storing a message in a tiered archive system. The tiered archive system may include an erasure code based object store in which erasure codes associated with the message may be stored. The erasure code based object store may have one or more devices (e.g., disks) on which the erasure codes may be stored.

Logic 1030 may also provide means (e.g., hardware, software, firmware, circuit) for determining a number of erasure codes to be written for the message in the erasure code based object store. The number of erasure codes to be written may depend on the number and types of devices available to store the message and on the number and types of devices available to the erasure code based object store.

Logic 1030 may also provide means (e.g., hardware, software, firmware, circuit) for determining a number of devices in the erasure code based object store to which the number of erasure codes are to be distributed. In one embodiment, the number of erasure codes and the number of devices may be manipulated to optimize a redundancy measure for the message. In one embodiment, the number of erasure codes and the number of devices may be manipulated to improve a redundancy measure for the message. In one embodiment, the number of erasure codes and the number of devices may be manipulated to provide a minimum acceptable redundancy in the shortest possible amount of time.

The means associated with logic 1030 may be implemented, for example, as an ASIC that implements the functionality of apparatus described herein. The means may also be implemented as computer executable instructions that implement the functionality of methods described herein and that are presented to computer 1000 as data 1016 that are temporarily stored in memory 1004 and then executed by processor 1002.

Generally describing an example configuration of the computer 1000, the processor 1002 may be a variety of various processors including dual microprocessor and other multi-processor architectures. A memory 1004 may include volatile memory and/or non-volatile memory. Non-volatile memory may include, for example, ROM, PROM, and other memory. Volatile memory may include, for example, RAM, SRAM, DRAM, and other memory.

A disk 1006 may be operably connected to the computer 1000 via, for example, an input/output interface (e.g., card, device) 1018 and an input/output port 1010. The disk 1006 may be, for example, a magnetic disk drive, a solid state disk drive, a floppy disk drive, a tape drive, a Zip drive, a flash memory card, a memory stick, or other device. Furthermore, the disk 1006 may be a CD-ROM drive, a CD-R drive, a CD-RW drive, a DVD ROM drive, a Blu-Ray drive, an HD-DVD drive, or other device. The memory 1004 can store a process 1014 and/or a data 1016, for example. The disk 1006 and/or the memory 1004 can store an operating system that controls and allocates resources of the computer 1000.

The bus 1008 may be a single internal bus interconnect architecture and/or other bus or mesh architectures. While a single bus is illustrated, it is to be appreciated that the computer 1000 may communicate with various devices, logics, and peripherals using other busses (e.g., PCIE, 1394, USB, Ethernet). The bus 1008 can be types including, for example, a memory bus, a memory controller, a peripheral bus, an external bus, a crossbar switch, and/or a local bus.

The computer 1000 may interact with input/output devices via the i/o interfaces 1018 and the input/output ports 1010. Input/output devices may be, for example, a keyboard, a microphone, a pointing and selection device, cameras, video cards, displays, the disk 1006, the network devices 1020, and other devices. The input/output ports 1010 may include, for example, serial ports, parallel ports, and USB ports.

The computer 1000 can operate in a network environment and thus may be connected to the network devices 1020 via the i/o interfaces 1018, and/or the i/o ports 1010. Through the network devices 1020, the computer 1000 may interact with a network. Through the network, the computer 1000 may be logically connected to remote computers. Networks with which the computer 1000 may interact include, but are not limited to, a LAN, a WAN, and other networks.

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A non-transitory computer-readable storage medium storing computer-executable instructions that when executed by a computer cause the computer to perform a method, the method comprising:
    accessing status data concerning a storage device in a tiered archive system, where the status data identifies an availability of the storage device, a capacity of the storage device, or a reliability of the storage device, where the tiered archive system includes an erasure code based object store or a non-object storage device, where the tiered archive system includes a plurality of devices arranged in different tiers, where the different tiers provide different levels of redundancy at different costs, and where accessing the status data includes receiving the status data from the storage device using a push model without querying the device;
    upon determining that the tiered archive system includes a threshold number of non-object storage devices:
        identifying, based at least in part on the status data, a first N/M redundancy policy for storing a message using the erasure code based object store and the non-object storage device, where the first N/M redundancy policy identifies a minimum number N–M of erasure codes needed to reconstruct the message and a maximum number N of erasure codes to be generated for the message, M being less than N, M and N being integers; and
        selectively causing a first erasure code associated with the message to be stored on the erasure code based object store, and selectively causing a second erasure code associated with the message to be stored on the non-object storage device;
    upon determining that the tiered archive system includes less than the threshold number of non-object storage devices:
        identifying, based at least in part on the status data, a second N/M redundancy policy for storing the message using the erasure code based object store, where the second N/M redundancy policy identifies a minimum number N–M of erasure codes needed to reconstruct the message and a maximum number N of erasure codes to be generated for the message, M being less than N, M and N being integers; and
        selectively causing an erasure code associated with the message to be stored on the erasure code based object store.

2. The non-transitory computer-readable storage medium of claim 1, where accessing the availability data includes querying the storage device.

3. The non-transitory computer-readable storage medium of claim 1, the method comprising generating the erasure code.

4. The non-transitory computer-readable storage medium of claim 1, where identifying the N/M redundancy policy is based, at least in part, a user defined rule.

5. The non-transitory computer-readable storage medium of claim 1, where identifying the N/M redundancy policy is based, at least in part, on an automated rule.

6. The non-transitory computer-readable storage medium of claim 5, where the automated rule identifies a minimum number of erasure codes to be present on a minimum number of different devices associated with the erasure code based object store.

7. The non-transitory computer-readable storage medium of claim 1, the method comprising:
    accessing updated status data concerning the storage device, where accessing the updated status data includes receiving the updated status data from the storage device using a push model without querying the device;
    identifying, based at least in part on the updated status data, an updated N/M redundancy policy;
    identifying, based at least in part on the updated status data and on the updated N/M redundancy policy, an updated object store device to store an erasure code associated with the message, and
    selectively causing the erasure code to be stored on the updated object store device according to the updated N/M redundancy policy.

8. The non-transitory computer-readable storage medium of claim 7, the method comprising:
    accessing the updated status data periodically,
    accessing the updated status data upon detecting a changed condition in the tiered distributed storage system, or
    accessing the updated status data as controlled by a control signal.

* * * * *